United States Patent
Shimizu

(10) Patent No.: US 9,460,767 B2
(45) Date of Patent: Oct. 4, 2016

(54) SEMICONDUCTOR MEMORY DEVICE

(71) Applicant: Naoki Shimizu, Seoul (KR)

(72) Inventor: Naoki Shimizu, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/871,063

(22) Filed: Sep. 30, 2015

(65) Prior Publication Data

US 2016/0019941 A1 Jan. 21, 2016

Related U.S. Application Data

(63) Continuation of application No. 14/201,618, filed on Mar. 7, 2014, now Pat. No. 9,177,626.

(60) Provisional application No. 61/870,727, filed on Aug. 27, 2013.

(51) Int. Cl.
| | |
|---|---|
| *G11C 11/16* | (2006.01) |
| *G11C 7/10* | (2006.01) |
| *G11C 13/00* | (2006.01) |
| *G11C 8/10* | (2006.01) |

(52) U.S. Cl.
CPC ......... *G11C 11/1653* (2013.01); *G11C 7/1093* (2013.01); *G11C 11/1675* (2013.01); *G11C 11/1693* (2013.01); *G11C 13/0004* (2013.01); *G11C 13/0007* (2013.01); *G11C 13/0023* (2013.01); *G11C 13/0061* (2013.01); *G11C 13/0069* (2013.01); *G11C 8/10* (2013.01)

(58) Field of Classification Search
CPC ... G11C 7/1093; G11C 8/10; G11C 11/1653; G11C 11/1675; G11C 11/1693; G11C 13/0004; G11C 13/0007; G11C 13/0023; G11C 13/0061; G11C 13/0069
USPC .......... 365/158, 148, 163, 185.25, 191, 203, 365/230.05
See application file for complete search history.

(56) References Cited

U.S. PATENT DOCUMENTS

| | | | |
|---|---|---|---|
| 7,675,800 B2 * | 3/2010 | Kawabata | ............. G11C 11/406 365/222 |
| 7,688,644 B2 * | 3/2010 | Han | ......................... G11C 8/10 365/189.05 |

(Continued)

FOREIGN PATENT DOCUMENTS

| | | |
|---|---|---|
| JP | 2010146252 A | 7/2010 |
| JP | 2012203938 A | 10/2012 |

OTHER PUBLICATIONS

International Search Report (ISR) including Written Opinion dated Oct. 14, 2014, issued in International Application No. PCT/JP2014/070416.

*Primary Examiner* — Tan T Nguyen
(74) *Attorney, Agent, or Firm* — Holtz, Holtz & Volek PC

(57) ABSTRACT

A semiconductor memory device includes: banks each including a memory cell array; word lines connected to rows of each of the banks; an address latch circuit configured to latch a full address for specifying one of the word lines, the full address including a first address and a second address; and a control circuit configured to ignore a reset operation for the first address as a target of a set operation, and overwrite the first address in accordance with the set operation when receiving a first command for specifying a reset operation for a bank and a set operation for the first address.

12 Claims, 8 Drawing Sheets

(56) References Cited

U.S. PATENT DOCUMENTS

| | | |
|---|---|---|
| 2003/0088753 A1 | 5/2003 | Ikeda et al. |
| 2005/0237820 A1 | 10/2005 | Takemura et al. |
| 2005/0243627 A1 | 11/2005 | Lee et al. |
| 2006/0034142 A1 | 2/2006 | Ooishi et al. |
| 2007/0171759 A1 | 7/2007 | Cheon |
| 2008/0144417 A1* | 6/2008 | Eguchi .................... G11C 8/12 365/222 |
| 2010/0110813 A1* | 5/2010 | Wilson ................ G11C 7/1078 365/203 |
| 2012/0051150 A1 | 3/2012 | Mirichigni et al. |
| 2013/0080826 A1 | 3/2013 | Kondo |

* cited by examiner

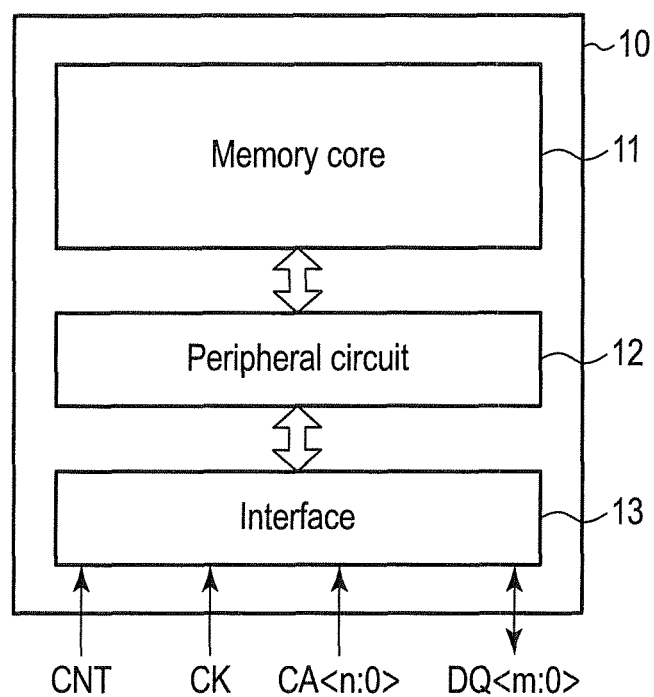
F I G. 1

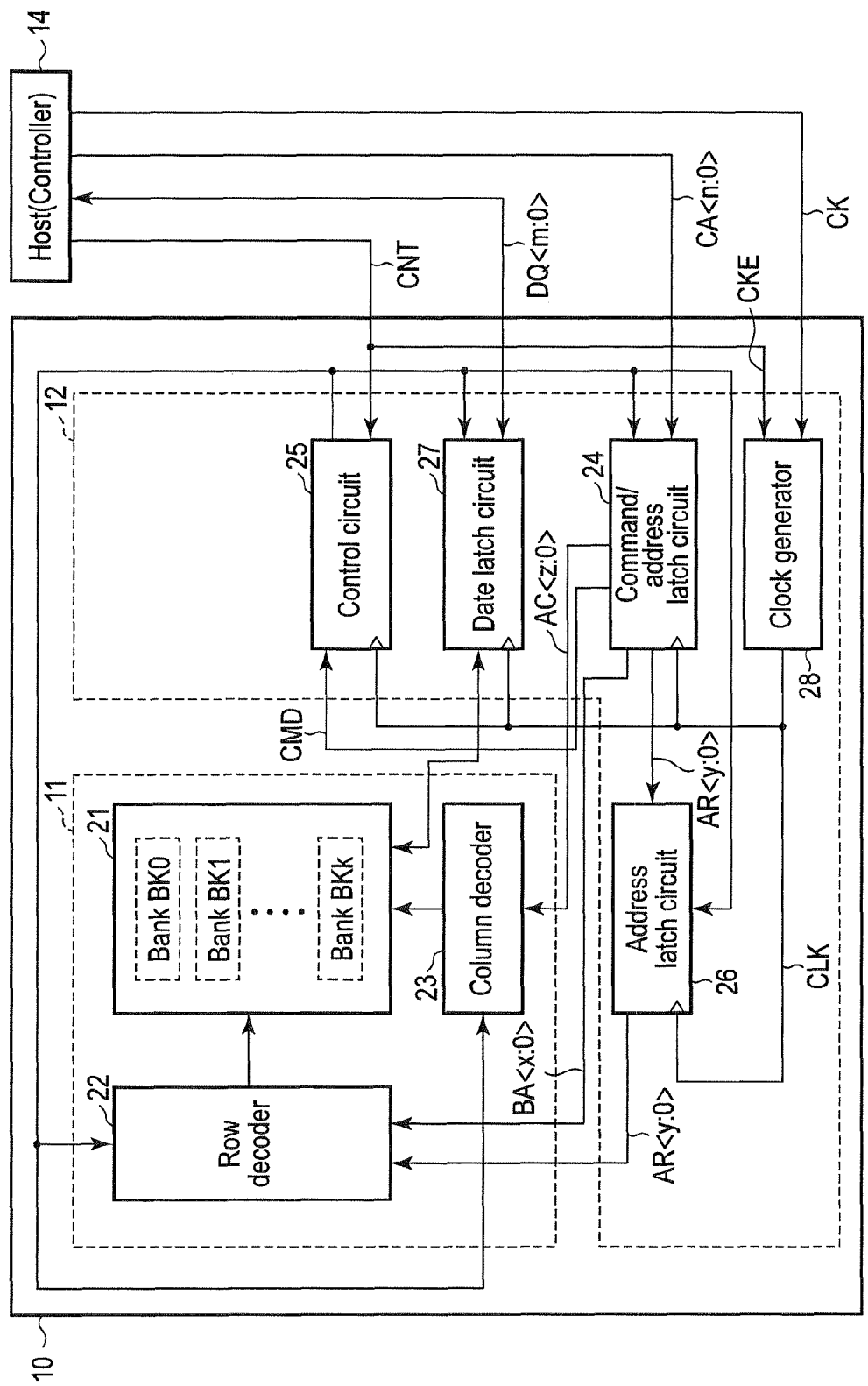
F I G. 2

| Precharge | CLK | CA0 | CA1 | CA2 | CA3 | CA4 | CA5 | CA6 | CA7 | CA8 | CA9 |
|---|---|---|---|---|---|---|---|---|---|---|---|
| | ↑ | H | H | L | H | AB | X | X | BA0 | BA1 | BA2 (For precharge) |
| | ↓ | X | X | X | R14 | R15 | R16 | R17 | BA0 | BA1 | BA2 (For preactive) |

FIG. 4

| Active | CLK | CA0 | CA1 | CA2 | CA3 | CA4 | CA5 | CA6 | CA7 | CA8 | CA9 |
|---|---|---|---|---|---|---|---|---|---|---|---|
| | ↑ | L | H | R8 | R9 | R10 | R11 | R12 | BA0 | BA1 | BA2 |
| | ↓ | R0 | R1 | R2 | R3 | R4 | R5 | R6 | R7 | R13 | X |

FIG. 5

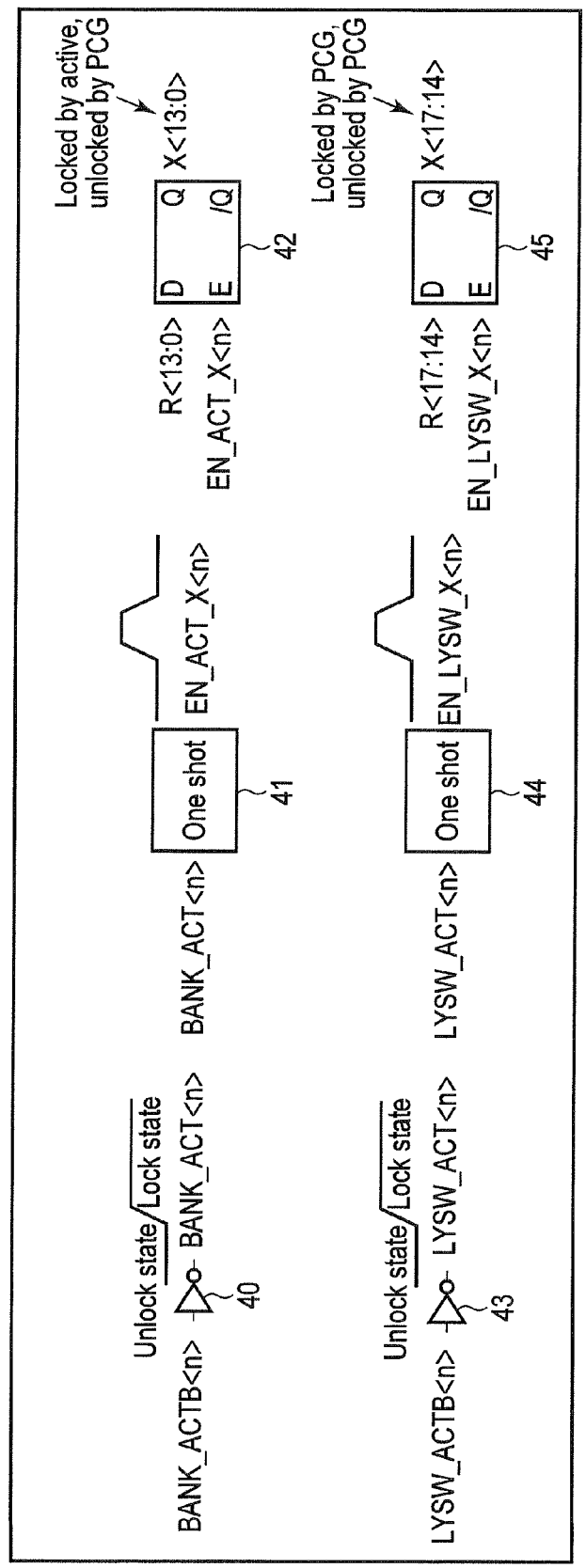
F I G. 6

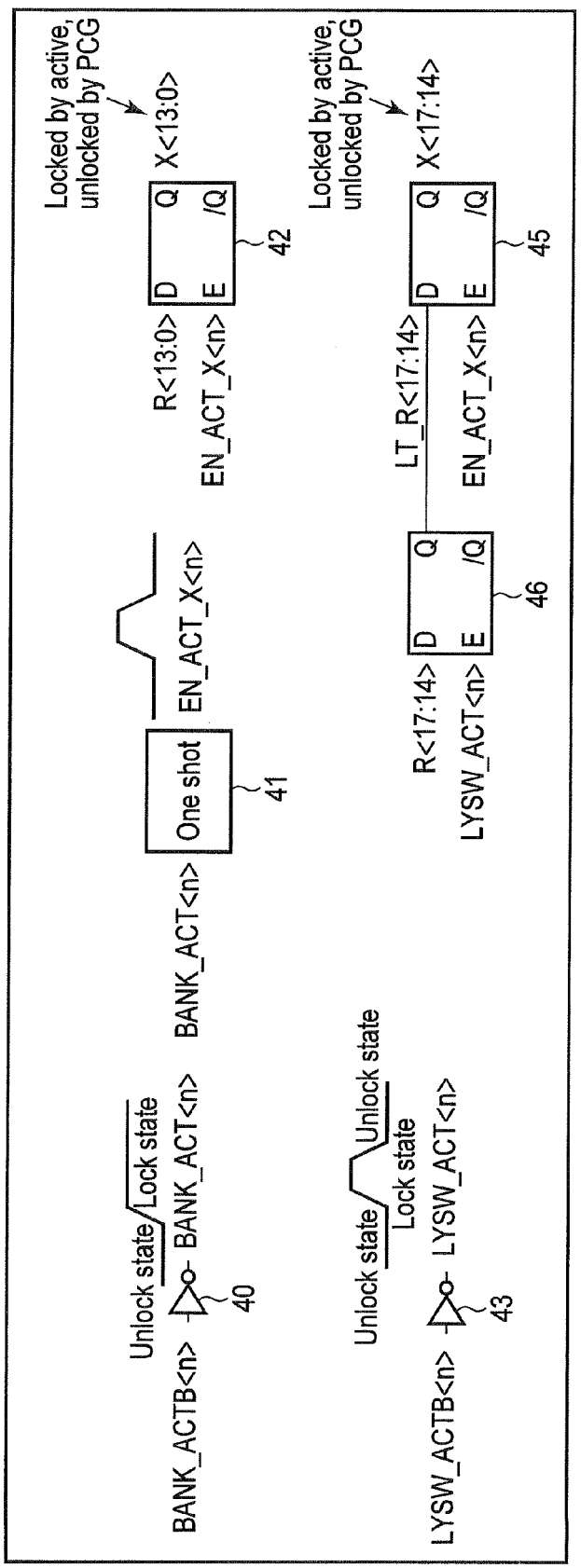
F I G. 8

SEMICONDUCTOR MEMORY DEVICE

CROSS-REFERENCE TO RELATED APPLICATIONS

This application is a Continuation application of U.S. application Ser. No. 14/201,618, filed Mar. 7, 2014, which claims the benefit of U.S. Provisional Application No. 61/870,727, filed Aug. 27, 2013, the entire contents of both of which are incorporated herein by reference.

FIELD

Embodiments described herein relate generally to a semiconductor memory device.

BACKGROUND

An MRAM (Magnetic Random Access Memory) is a memory device using a magnetic element having a magnetoresistive effect as a memory cell for storing information, and is attracting attention as a next-generation nonvolatile memory device capable of a high-speed operation and having a large capacity. Also, the MRAM has been researched and developed as a memory to replace a volatile memory such as a DRAM or SRAM. In this case, it is desirable to operate the MRAM by using the same specifications as those of the DRAM or SRAM, in order to reduce the development cost and make the replacement smooth.

BRIEF DESCRIPTION OF THE DRAWINGS

FIG. 1 is a schematic view of a semiconductor memory device according to an embodiment;

FIG. 2 is a block diagram showing examples of a memory core 11 and its peripheral circuit;

FIG. 4 is a view illustrating command/address assignment concerning a precharge command;

FIG. 5 is a view illustrating command/address assignment concerning an active command;

FIG. 6 is a view illustrating operations according to Comparative Example 1;

FIG. 8 is a view illustrating operations according to an example;

DETAILED DESCRIPTION

Figure 3:
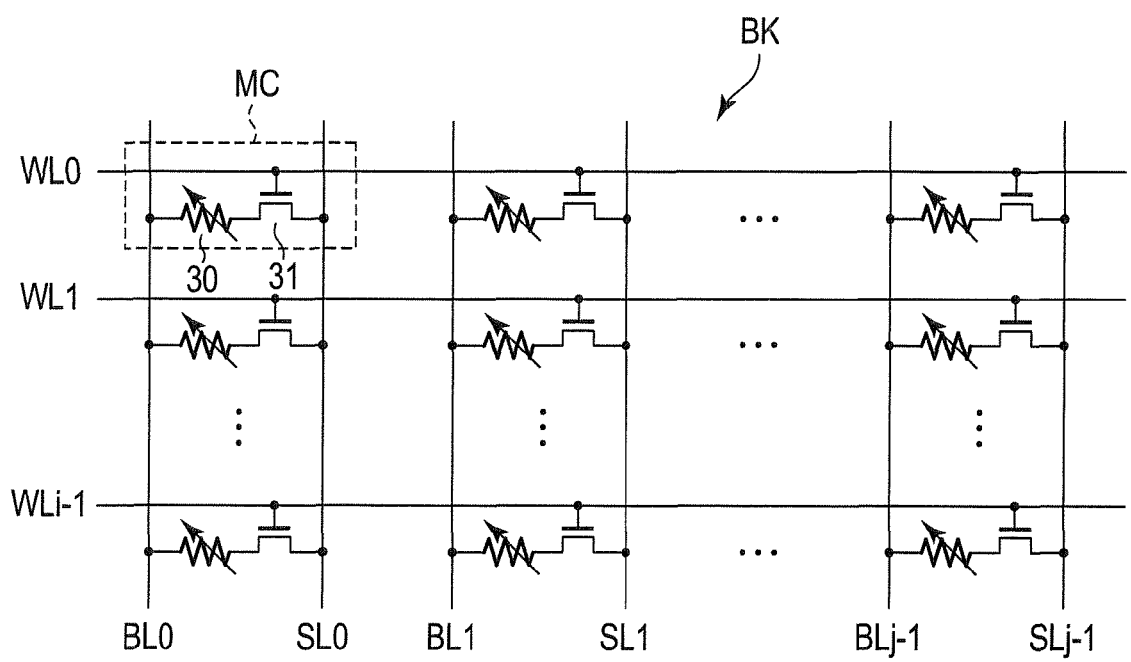
FIG. 3 is a circuit diagram of a memory cell array included in one bank.

In general, according to one embodiment, there is provided a semiconductor memory device comprising:
banks each including a memory cell array;
word lines connected to rows of each of the banks;
an address latch circuit configured to latch a full address for specifying one of the word lines, the full address including a first address and a second address; and
a control circuit configured to ignore a reset operation for the first address as a target of a set operation, and overwrite the first address in accordance with the set operation when receiving a first command for specifying a reset operation for a bank and a set operation for the first address.

The embodiment of the present invention will be explained below with reference to the accompanying drawings. Note that in the following explanation, the same reference numerals denote elements having the same functions and arrangements, and a repetitive explanation will be made only when necessary.

This embodiment will be explained by taking an MRAM (Magnetic Random Access Memory) as an example of the semiconductor memory device.

FIG. 1 is a schematic view showing a semiconductor memory device 10 according to this embodiment. The semiconductor memory device 10 includes a memory core 11, peripheral circuit 12, and interface 13.

The memory core 11 includes a plurality of memory cells for storing data. The peripheral circuit 12 performs data write, data read, and the like for the memory core 11.

The interface 13 receives a control signal CNT for read/write and a clock CK for controlling the operation timing of read/write from an external device (host). Also, the interface 13 is connected to the host by a command/address line CA<n:0> and data line DQ<m:0>, wherein n and m are natural numbers.

The control signal CNT includes a clock enable signal CKE, chip select signal CS, and the like. The clock CK is used to control the operation timing of the semiconductor memory device 10. The command/address line CA<n:0> is used to transmit/receive commands and addresses. The data line DQ<m:0> is used to transmit/receive input data and output data.

FIG. 2 is a block diagram showing examples of the memory core 11 and peripheral circuit 12. The memory core 11 includes a memory cell array unit 21, row decoder 22, and column decoder 23. The memory cell array unit 21 includes (k+1) banks BK0 to BKk, wherein k is a natural number. The banks BK0 to BKk can be activated independently of each other. For example, the power consumption can be reduced by activating only a necessary bank during read/write.

The row decoder 22 decodes, e.g., a bank address BA<x:0> for selecting one of the banks BK0 to BKk, and a row address AR<y:0> for selecting a row in the selected bank.

The column decoder 23 decodes, e.g., a column address AC<z:0> for selecting a column in the memory cell array unit 21.

The peripheral circuit 12 includes a command/address latch circuit 24, control circuit 25, address latch circuit 26, data latch circuit 27, and clock generator 28.

The command/address latch circuit 24 receives a command CMD and address ADD from a host 14 through the command/address line CA<n:0>, and temporarily stores them. The command CMD is supplied to the control circuit 25. Based on the control signal CNT and command CMD from the host 14, the control circuit 25 controls the internal operation of the semiconductor memory device 10.

Of the address ADD, the bank address BA<x:0> is supplied to the row decoder 22, the row address AR<y:0> is supplied to the address latch circuit 26, and the column address AC<z:0> is supplied to the column decoder 23.

In this embodiment as will be described later, the address latch circuit 26 latches a part of a full row address when an active command is input, and also latches another part of the full row address in advance when a precharge command that is input before the active command is input.

Thus, a part of the row address is input before the active command is input. Therefore, even when, for example, the number of bits of the row address for selecting a word line (row) in the memory cell array unit 21 increases, the semiconductor memory device can be incorporated into the system without increasing the number of pins and decreasing the operation speed, i.e., without changing the specifications.

Note that the precharge command is a command for setting a selected bank in an initial state (precharge state) for a read operation or write operation. More specifically, all word lines, all bit lines, and all source lines are inactivated. The active command is a command for performing a process of reading data from the memory cell array by activating one of a plurality of word lines in the selected bank.

The data latch circuit 27 temporarily stores input data that is input from the host 14 through the data line DQ<m:0>, or output data that is read from a selected bank. The input data is written to a selected bank.

The clock generator 28 generates an internal clock CLK based on the clock CK from the host 14. The internal clock CLK is input to the command/address latch circuit 24, control circuit 25, address latch circuit 26, and data latch circuit 27, and used to control the operation timings of these circuits.

FIG. 3 is a circuit diagram of a memory cell array included in one bank. This memory cell array is formed by arranging a plurality of memory cells MC in a matrix. The memory cell array includes a plurality of word lines WL0 to WLi-1, a plurality of bit lines BL0 to BLj-1, and a plurality of source lines SL0 to SLj-1. One row of the memory cell array is connected to one word line WL, and one column of the memory cell array is connected to a pair of one bit line BL and one source line SL.

The memory cell MC includes a magnetoresistive element (MTJ (Magnetic Tunnel Junction) element) 30 and select transistor 31. The select transistor 31 is, e.g., an N-channel MOSFET.

The MTJ element 30 has one terminal connected to the bit line BL, and the other terminal connected to the drain of the select transistor 31. The gate of the select transistor 31 is connected to the word line WL, and its source is connected to the source line SL.

<Command/Address Assignment>

Next, command/address assignment will be explained. FIG. 4 is a view illustrating command/address assignment concerning the precharge command. FIG. 5 is a view illustrating command/address assignment concerning the active command.

Referring to FIGS. 4 and 5, the arrows of the clock CLK indicate the rising edge and falling edge of the clock. Reference symbols CA0 to CA9 indicate commands and addresses input from command/address pads (command/address lines). The number of command/address pads is an example, and is not limited to this. A bank address BA for specifying a bank has, e.g., three bits (BA0 to BA2). A row address R has, e.g., 18 bits (R0 to R17). Of the bits R0 to R17 of the full row address, a first row address (a part of the full row address) input together with the precharge command has, e.g., upper bits R14 to R17. Of the bits R0 to R17 of the full row address, a second row address (another part of the full row address) input together with the active command has, e.g., lower bits R0 to R13.

Referring to FIG. 4, a precharge operation is specified at the rising edge of the clock CLK when the precharge command is input, and a preactive operation is specified by the falling edge of the clock CLK. That is, the precharge command can set the precharge operation and preactive operation. The precharge command is defined by asserting a chip select signal CS, and using CA0=H, CA1=H, CA2=L, and CA3=H at the rising edge of the clock CLK.

In the precharge operation, a flag AB for specifying whether to precharge all banks is input from the pad CA4, and the bank addresses BA0 to BA2 are input from the pads CA7 to CA9. "X" means don't care.

In the preactive operation, the upper row addresses R14 to R17 are input from the pads CA3 to CA6, and the bank addresses BA0 to BA2 are input from the pads CA7 to CA9. In this embodiment, the bank addresses BA0 to BA2 can be specified in each of the precharge operation and preactive operation. For the same precharge command, therefore, the precharge operation and preactive operation can be performed in different banks.

Referring to FIG. 5, the active operation is specified at the rising edge and falling edge of the clock CLK when the active command is input. The active command is defined by asserting the chip select signal CS, and using CA0=L and CA1=H at the rising edge of the clock CLK. Also, at the rising edge of the clock CLK, the row addresses R8 to R12 are input from the pads CA2 to CA6, and the bank addresses BA0 to BA2 are input from the pads CA7 to CA9. At the falling edge of the clock CLK, the row addresses R0 to R13 are input from the pads CA0 to CA8.

Comparative Example 1

Operations according to Comparative Example 1 will be explained below. Comparative Example 1 is an example in which the bank address of the precharge operation and that of the preactive operation are different. FIG. 6 is a view illustrating the operation of Comparative Example 1.

A signal BANK_ACTB<n> is generated inside the semiconductor memory device 10, wherein n is the ordinal number of a bank. The signal BANK_ACTB<n> is generated by using the active command and bank addresses BA0 to BA2. An inverter circuit 40 inverts the logic of the signal BANK_ACTB<n>, and outputs a signal BANK_ACT<n>. When the active command is input, the signal BANK_ACT<n> of a selected bank changes from Low level to High level. In response to the signal BANK_ACT<n>, row address R<13:0> changes from an unlock state to a lock state. A pulse generator (one shot) 41 receives the signal BANK_ACT<n>, and generates an enable signal EN_ACT_X<n> containing one pulse.

Row address R<13:0> is input to an input terminal D of a latch circuit 42, and the enable signal EN_ACT_X<n> is input to an enable terminal E of the latch circuit 42. When the enable signal EN_ACT_X<n> is asserted, the latch circuit 42 latches row address R<13:0>, and outputs latched row address X<13:0>. That is, row address X<13:0> is locked by the one-pulse enable signal EN_ACT_X<n>. On the other hand, row address X<13:0> is unlocked by the precharge operation.

A signal LYSW_ACTB<n> is generated inside the semiconductor memory device 10. The signal LYSW_ACTB<n> is generated by using the precharge command and bank addresses BA0 to BA2. An inverter circuit 43 inverts the logic of the signal LYSW_ACTB<n>, and outputs a signal LYSW_ACT<n>. When the precharge operation and preactive operation are successively set (at the rising edge and falling edge of one clock) for two different banks, the signal LYSW_ACT<n> changes from Low level to High level in each of the two different banks. In response to the signal LYSW_ACT<n>, row address R<17:14> changes from the unlock state to the lock state. A pulse generator (one shot) 44 receives the signal LYSW_ACT<n>, and generates an enable signal EN_LYSW_X<n> containing one pulse.

Row address R<17:14> is input to an input terminal D of a latch circuit 45, and the enable signal EN_LYSW_X<n> is input to an enable terminal E of the latch circuit 45. When the enable signal EN_LYSW_X<n> is asserted, the latch circuit 45 latches row address R<17:14>, and outputs latched row address X<17:14>. That is, row address X<17:14> is locked by the one-pulse enable signal EN_LYSW_X<n>. On the other hand, row address X<17:14> is unlocked by the precharge operation.

As described previously, Comparative Example 1 is an example in which the bank address of the precharge operation and that of the preactive operation are different. When the preactive operation is performed in Comparative Example 1, row address R<17:14> of the bank is locked by the precharge command. Therefore, the precharge command cannot be used as a signal for resetting row address R<17:14> after the power supply is turned on.

Comparative Example 2

Figure 7:
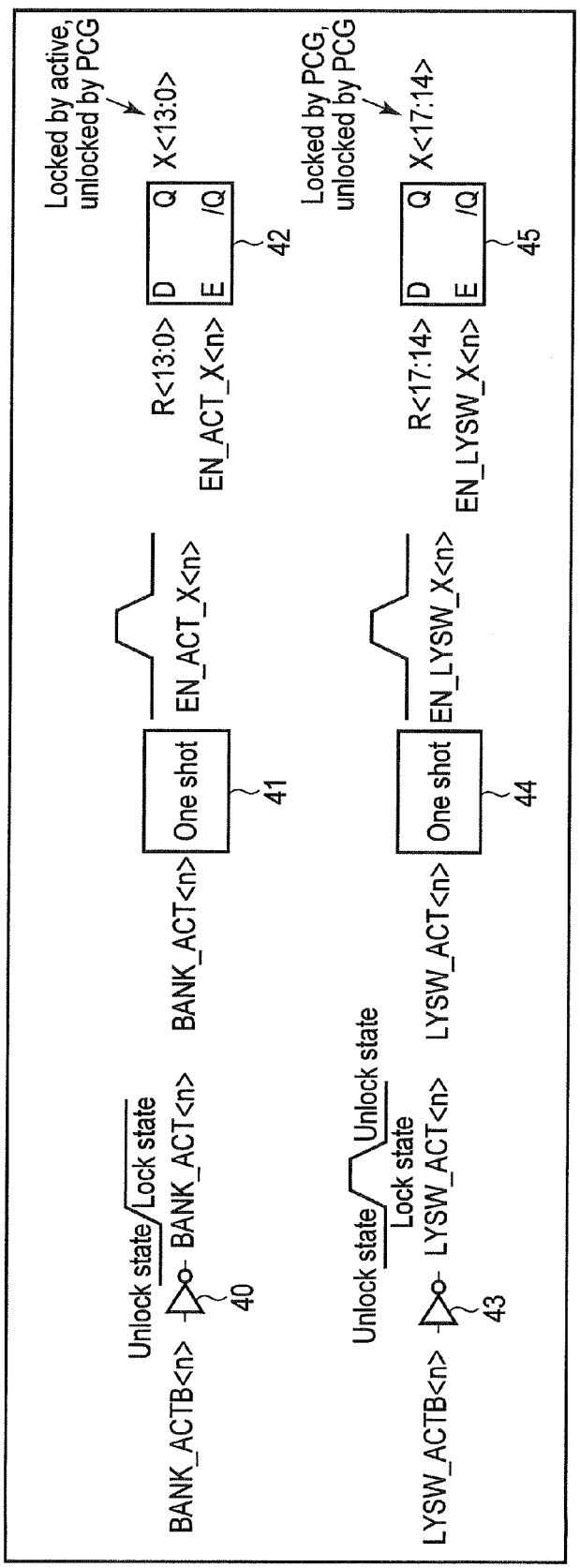
FIG. 7 is a view illustrating operations according to Comparative Example 2.

Operations according to Comparative Example 2 will be explained below. Comparative Example 2 is an example in which the bank address of the precharge operation and that of the preactive operation are the same. FIG. 7 is a view illustrating the operation according to Comparative Example 2. The operations of locking and unlocking row address R<13:0> are the same as those of Comparative Example 1.

When the precharge operation and preactive operation are successively set (at the rising edge and falling edge of one clock) for the same bank, the signal LYSW_ACT<n> changes in the order of Low level, High level, and Low level. In response to the signal LYSW_ACT<n>, row address R<17:14> changes in the order of the unlock state, lock state, and unlock state. That is, row address X<17:14> output from the latch circuit 45 is unlocked by the precharge operation specified by the same precharge command, and locked by the preactive operation.

In Comparative Example 2, the bank address of the precharge operation and that of the preactive operation are the same. This is asynchronous design in which row address R<17:14> is set after the bank is reset, resulting in severe timings.

Example

The example will now be explained. FIG. 8 is a view illustrating an operation according to the example. The operations of locking and unlocking row address R<13:0> are the same as those of Comparative Example 1.

Referring to FIG. 8, a prelatch circuit 46 is added. Row address R<17:14> is input to an input terminal D of the prelatch circuit 46, and the signal LYSW_ACT<n> is input to an enable terminal E of the prelatch circuit 46. When the signal LYSW_ACT<n> is asserted, the prelatch circuit 46 latches row address R<17:14>, and outputs latched row address LT_R<17:14>.

Row address LT_R<17:14> is input to the input terminal D of the latch circuit 45, and the enable signal EN_ACT_X<n> is input to the enable terminal E of the latch circuit 45. When the enable signal EN_ACT_X<n> is asserted, the latch circuit 45 latches row address LT_R<17:14>, and outputs latched row address X<17:14>

By the operation as described above, the prelatch circuit 46 can overwrite row address LT_R<17:14>. That is, since the enable signal LYSW_ACT<n> for the prelatch circuit 46 is kept asserted until the next precharge operation, row address LT_R<17:14> is not locked by the precharge command but overwritten whenever the preactive operation is performed. This solves the problem of Comparative Example 1.

Also, when the active command is input, the latch circuit 45 latches row address LT_R<17:14>, and outputs latched row address X<17:14>. That is, row address X<17:14> is locked by the enable signal EN_ACT_X<n> containing one pulse. In other words, row address X<17:14> is locked in response to the active command. This solves the problem of Comparative Example 2.

Note that the inverter circuit 40 for generating the signal BANK_ACT<n> and the inverter circuit 43 for generating the signal LYSW_ACT<n> are included in, e.g., the interface 13 shown in FIG. 1. The pulse generator 41 for generating the enable signal EN_ACT_X<n> and the pulse generator 44 for generating the enable signal EN_LYSW_X<n> are included in, e.g., the control circuit 25 shown in FIG. 2. The latch circuits 42 and 45 and prelatch circuit 46 are included in, e.g., the address latch circuit 26 shown in FIG. 2.

Figure 9:
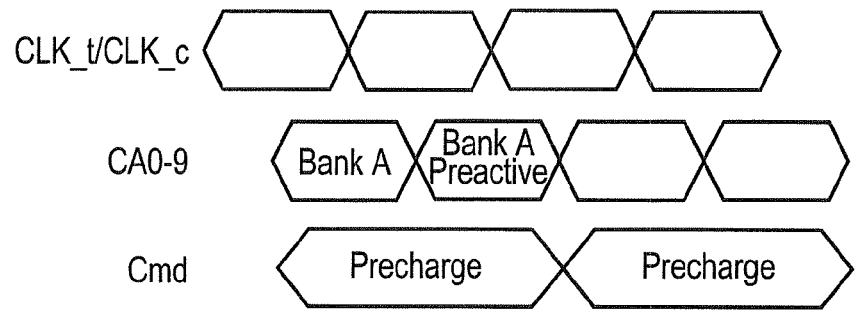
FIG. 9 is a timing chart according to an example of an input command.

FIG. 9 is a timing chart showing an example of an input command. Referring to FIG. 9, clocks CLK_t and CLK_c are complementary clocks.

A precharge command is input to bank A. In response to this precharge command, a precharge operation is specified at the rising edge of the clock, and a preactive operation is specified at the falling edge of the clock.

When the command as shown in FIG. 9 is input in this example, the precharge operation is ignored and only the preactive operation is performed for a preactive row address. In this preactive operation, the preactive row address is overwritten in the address latch circuit 26. This relaxes the internal timings of the semiconductor memory device 10.

Figure 10:
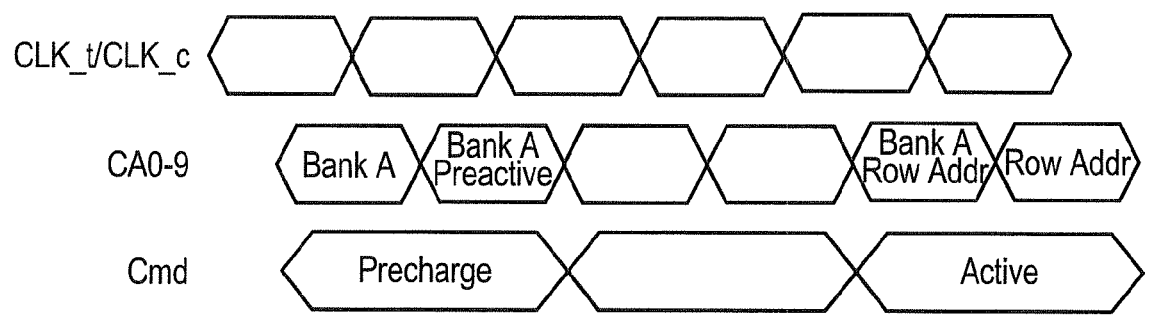
FIG. 10 is a timing chart according to other examples of the input command.

FIG. 10 is a timing chart showing other examples of the input command. A precharge command is input to bank A. In response to this precharge command, a precharge operation is specified at the rising edge of the clock, and a preactive operation is specified at the falling edge of the clock. Subsequently, an active command is input to bank A, and an active operation is specified. In this active operation, the address latch circuit 26 locks a row address at the rising edge and falling edge of the clock. When the commands as shown in FIG. 10 are input in this example, the full row address is locked by the active operation.

Note that in the above-mentioned example, an MRAM using a magnetoresistive element has been taken as an example of the semiconductor memory device. However, the present invention is not limited to this but is applicable to various kinds of semiconductor memory devices including both volatile and nonvolatile memories. The present invention is also applicable to a resistance-change memory of the same kind as the MRAM, e.g., an ReRAM (Resistive Random Access Memory) and PCRAM (Phase-Change Random Access Memory).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
banks each including a memory cell array;
word lines connected to rows of each of the banks;
an address latch circuit which latches address bits for identifying one of the word lines, the address bits including a first address portion and a second address portion; and
a control circuit which is capable of receiving a precharge command and an active command in response to a clock signal,
wherein:
the precharge command includes a preceding command portion for identifying a precharge operation for a bank and a following command portion for setting the first address portion,
the active command activates a word line in the bank, and
the control circuit is capable of overwriting the first address portion until receiving the active command.

2. The device of claim 1, wherein the first address portion and the second address portion are locked when the control circuit receives the active command.

3. The device of claim 1, wherein:
the control circuit is capable of receiving the first address portion with the precharge command, and
the control circuit is capable of receiving the second address portion with the active command.

4. The device of claim 1, wherein:
the address latch circuit includes a first latch circuit and a second latch circuit,
the first latch circuit latches the first address portion in response to the precharge command, and
the second latch circuit latches the first address portion in response to the active command.

5. The device of claim 4, wherein the address latch circuit includes a third latch circuit which latches the second address portion in response to the active command.

6. The device of claim 1, wherein the memory cell array includes a magnetoresistive element.

7. A semiconductor memory device comprising:
banks each including a memory cell array;
word lines connected to rows of each of the banks;
an address latch circuit which latches address bits for identifying one of the word lines, the address bits including a first address portion and a second address portion; and
a control circuit which is capable of receiving a precharge command and an active command in response to a clock signal,
wherein:
the precharge command includes a preceding command portion for identifying a precharge operation for a bank and a following command portion for setting the first address portion,
the active command activates a word line in the bank, and
the first address portion is locked when the control circuit receives the active command.

8. The device of claim 7, wherein the second address portion is locked when the control circuit receives the active command.

9. The device of claim 7, wherein:
the control circuit is capable of receiving the first address portion with the precharge command, and
the control circuit is capable of receiving the second address portion with the active command.

10. The device of claim 7, wherein:
the address latch circuit includes a first latch circuit and a second latch circuit,
the first latch circuit latches the first address portion in response to the precharge command, and
the second latch circuit latches the first address portion in response to the active command.

11. The device of claim 10, wherein the address latch circuit includes a third latch circuit which latches the second address portion in response to the active command.

12. The device of claim 7, wherein the memory cell array includes a magnetoresistive element.

* * * * *